United States Patent [19]
Lewis et al.

[11] 3,944,421
[45] Mar. 16, 1976

[54] PROCESS FOR SIMULTANEOUS DEVELOPMENT AND ETCH OF PHOTORESIST AND SUBSTRATE

[75] Inventors: James M. Lewis, Aurora; Raymond W. Newyear, Willoughby, both of Ohio

[73] Assignee: Horizons Incorporated, a division of Horizons Research Incorporated, Cleveland, Ohio

[22] Filed: Oct. 3, 1973

[21] Appl. No.: 403,222

[52] U.S. Cl. .................. 96/36; 96/36.2; 96/48 R; 156/8; 156/13; 156/15
[51] Int. Cl.² ............................................. G03C 5/00
[58] Field of Search .................. 96/36, 48 R, 36.2; 252/79.1, 79.5; 156/8, 13, 15

[56] References Cited
UNITED STATES PATENTS

| | | | |
|---|---|---|---|
| 3,019,106 | 1/1962 | Adams | 96/48 R |
| 3,399,994 | 9/1968 | Watkinson | 96/48 R |
| 3,639,185 | 2/1972 | Colom | 96/36.2 |
| 3,698,904 | 10/1972 | Fukui et al. | 96/36 |

*Primary Examiner*—David Klein
*Assistant Examiner*—Edward C. Kimlin
*Attorney, Agent, or Firm*—Lawrence I. Field

[57] ABSTRACT

Photoresists are developed and the supporting substrate is etched simultaneously therewith by bringing the resist (after exposure) into physical contact with a fluid containing a developer for the resist and an etchant for the supporting substrate.

4 Claims, No Drawings

PROCESS FOR SIMULTANEOUS DEVELOPMENT AND ETCH OF PHOTORESIST AND SUBSTRATE

This invention relates to photoresists based on non-silver photosensitive compositions and to an improved process for using such photoresists.

Photoresists and the manner in which they have been utilized industrially are described in Penrose Ann. 1955, pp. 118–121 and in other texts readily available to persons interested in this art.

It has been conventional to apply relatively thin films of photosensitive compositions to suitably conditioned (cleaned) substrates, and to then expose the photosensitive coating to a pattern of radiation illumination in order to produce exposed and unexposed areas in the film, reproducing the pattern to radiation. For non-silver films such as those described in Wainer, U.S. Pat. No. 3,042,517 issued July 3, 1962, and U.S. Pat. No. 3,046,125 issued July 24, 1962, the image in the film may be fixed by subjecting the entire film to heat or to infrared radiation. As a result of the exposure and fixing the film usually exhibits varying solubilities in selected solvents and in use is made of this to "develop" an image by washing off either the exposed areas of the film or the unexposed areas depending on whether a positive image or a negative image of the pattern of exposure is desired. Thereafter it has been customary to subject the resulting article to a baking step, or further heating to remove any residual solvent and to improve the properties of the portions of the original film which remain after the development step and to then etch the uncovered areas of the base to create either a positive or negative reproduction of the original pattern of illumination. Finally all residue of the photosensitive coating is stripped from the base either mechanically or chemically, leaving an image bearing base which may be used ornamentally or in lithographic printing or otherwise depending on whether the base is metal or synthetic resin or glass or other material.

This invention is directed to the elimination of process steps in the photofabrication of a wide variety of products like printed circuits, integrated circuits, photomasks, lithographic plates, nameplates, precision parts, etc. This is of great practical importance because the number of process steps is inversely related to ultimate cost, productivity and yield. For example, if the average yield per process step is 90 percent, the net yield at the end of a six-step process will be 12 percent lower than for a four-step process.

Briefly, it has been found that after exposure and thermal fixing have been carried out in the usual way, the film may be etched and developed in a single step provided a suitable etchant is selected, the etchant being capable of first penetrating through the unexposed areas of the light sensitive layer and etching the underlying supporting surface and at the same time washing away or dissolving the original layer of unexposed photosensitive material. Thereafter the remaining areas of the exposed photosensitive material are stripped from the supporting substrate.

By operating in the manner described the procedure is greatly simplified since the usual wash-off step to develop an image in the photosensitive layer and the post thermal baking step to expel wash off solvent are eliminated.

A manufacturer of photoresists begins with raw material which costs less than 1 cent per square inch. By the time the photofabrication process is complete, the value of the manufactured items has increased to a dollar or more per square inch. Accordingly, product yield (output divided by input) affects cost dramatically. Even production rate, important though it is, does not have such a substantial effect on manufacturing cost. If one of the processing steps produces a flaw in the part, it is a non-recoverable loss. The monetary loss increases with each successive downstream step.

Virtually all photoresists are prepared by a procedure along the following lines:

1. Contact print exposure to a light image. (Some photoresists require heating after exposure; others do not.)
2. Development with a suitable solvent for exposed or unexposed areas depending on whether the photoresist is positive or negative working.
3. Baking to evaporate developer as well as improve the adherence of the remaining photoresist to the substrate.
4. Etching to produce the requisite geometrical pattern in the substrate.
5. Stripping to remove the residual photoresist, leaving a completed article of manufacture.

From the standpoint of quality control and manufacturing cost the most critical processes are development and baking.

Incomplete development will leave thin films which are not readily discernible by production personnel, small islands or thin strings of material, commonly called "stringers" in the trade. In all cases, subsequent etching will produce rejects. Overdevelopment results in ragged edges, photoresist undercutting (degrading adhesion somewhat), and line and area widths greater than design specifications.

Similarly, post-development baking at too low a temperature or too short a time will leave developer solution in the remaining photoresist and reduce adhesion to the substrate. Such a condition often leads to loss of all or part of the photoresist during etching. Result is, again, defective products. Conversely, if the baking temperature is too high or time at temperature too long, the resist may be embrittled, giving rise to cracks and edge lifting. Etchant will penetrate and react in undesirable areas. Once again, yield decreases.

Finally, there is the simple matter of yield as a function of the number of processing steps. As previously indicated, there are five (or six) steps common to all photoresists, excluding coating and drying. Were separate development and etching eliminated, not only would production rates increase but yield also increases. For example, assume yield per step is 90%. In a five-step process, final yield decreases to about 59%. Were the number of steps reduced to three, product yield for the entire process would increase to 73%. The percentage difference is 25%. Consequently, there is ample practical justification for attempts to reduce the number of process steps and particularly to eliminate development and baking from the photofabrication process.

Thus, the practical, commercial significance of reducing the number of photofabrication processes is readily evident and has been well recognized in the industry. However, heretofore, an economical, reliable, reproducible method for achieving this objective has not been available, i.e., yield and production rate increase while simultaneously reducing total cost of photofabricated parts.

This invention achieves this objective by "simultaneously" developing and etching with modified, commercially used etching solutions. "Developer" reagents added to these solutions do not degrade the performance of the etchant. The photoresist areas to be removed are attacked and partially degraded first. Thereafter, development and etching proceed simultaneously. Finally, all the photoresist is removed and etching is completed. When treatment is complete, neither photoresist nor substrate to be etched remain in the requisite areas. Results are exceedingly precise, high quality photofabricated products which include microelectronic circuits. Time required is significantly shorter than for sequential development, postdevelopment bake and etching.

The following description will serve to further illustrate preferred practice of this invention and is not intended to limit the same.

Suitable substrates on which the photosensitive material is supported include: metals such as copper, chromium, steel, aluminum; the oxides of silicon, aluminum, iron or chromium, glass, synthetic polymers and other suitable materials.

Etchants matched to the substrate to be etched included solutions of HCl, HF, $H_2SO_4$, $Cr_2O_3 \cdot H_2O$ and $HNO_3$ and mixtures of such acids. Etching may also be accomplished with alkaline etchants. Caustic solutions neither permeate nor attack non-light exposed photoresists. Thus, the same technique must be modified for substrates which are caustic etched. Methyl and ethyl alcohols can be added to caustic solutions without significantly affecting their efficacy as etchants, and 95% methanol is the normal liquid developer for these photoresists. Thus, addition of 10–20% methanol to a caustic solution permits simultaneous development and etching. The alcohol dissolves the unexposed areas so that the caustic can react with the underlying substrate. After etching is complete, the resist still remains in only the light exposed areas. Rinsing does not remove it. Stripping is again required.

The present invention is applicable to photoresist production utilizing a wide variety of known resist materials, many of which are commercially available, and is directed to a simplification in the procedure whereby the resist is manufactured.

For purposes of illustration, a particularly preferred photosensitive composition comprising:

an N-vinyl amine (N-vinylcarbazole),
a haloalkane (iodoform), and
a binder (polyvinyl butyral) is employed as the photoresist material, but it is to be understood that the invention is applicable to many other photosensitive compositions.

The photosensitive layer is usually 0.5 – 5 microns thick. Exposures to a pattern of light through a negative or stencil using an exposure to 10 millijoules/square cm, and fixing at about 80°C to 160°C for up to about 60 seconds are preferred.

The relative proportions of N-vinylcarbazole and iodoform are in the range 2/3 to 1/1, and the amount of polyvinyl butyral is about equal to weight of NVC + $CHI_3$. The ingredients are deposited onto a clean substrate from a solution, usually in a mixture of solvents.

In the examples which follow, the invention is illustrated with reference to a preferred photosensitive composition comprising an N-vinyl amine (N-vinylcarbazole), a haloalkane (iodoform), and a binder (high molecular weight polyvinyl butyral), but it will be understood that by a suitable choice of etchants and developers (solvents for the unexposed resist areas) the invention can be applied to a wide range of other photoresist compositions. Other non-silver photoresist compositions to which the present invention is applicable include those described in presently pending U.S. Pat. applications Ser. No. 141,393 filed May 7, 1971, now U.S. Pat. No. 3,769,023, and Ser. No. 224,939, filed Feb. 9, 1972, now abandoned, the disclosures of which are incorporated by reference. Application Ser. No. 141,393 issued as U.S. Pat. No. 3,769,023 on Oct. 30, 1973; and a division of application Ser. No. 224,939 issued as U.S. Pat. No. 3,899,338 on Aug. 12, 1975.

EXAMPLE 1 (PRIOR ART)

A photoresist solution was prepared by adding 10.7 grams Monsanto B-72A polyvinyl butyral, 6.0 grams N-vinylcarbazole, and 4.5 grams iodoform to 306 grams of a mixture of alcohols, approximately 70% ethyl alcohol, 15% n-propyl alcohol and 15% n-butyl alcohol. This solution was bar coated on a printed circuit board comprising a thin layer of copper on a resin base. The copper thickness was about 2.8 mils. A wet photoresist film thickness of approximately 1.5 mils produced a dry film about 70 microinches thick. After removing solvents by gentle heating at 31°C for 90 seconds, contact print exposure was made with a 400-watt medium pressure mercury lamp, 18 inches away for 10 seconds. Heating to 100°C for 60 seconds was followed by etching in a laboratory spray etcher filled with a copper etching solution comprised of 10% chromic acid and 20% sulfuric acid in water. Neither the exposed nor unexposed areas were affected after 30 minutes.

EXAMPLE 2 (PRIOR ART)

The heating step in Example 1 was followed by immersion in methanol for one minute to dissolve (develop) the unexposed areas and this was followed by another heating at 100°C for 1 minute. Thereafter, treatment in the laboratory spray etcher as in Example 1 resulted in complete removal of the copper in only the non-light exposed areas within six minutes.

EXAMPLE 3 (COMPARISON)

A printed circuit board blank was coated and processed as in Example 1. Immersion in a beaker filled with 500 ml water, 125 grams ammonium pesulfate and 10 mag mercuric chloride maintained at 125°F for 30 minutes did not result in etching of exposed or unexposed areas.

EXAMPLE 4 (COMPARISON)

A 40 microinch thick dry photoresist film was applied to aluminum on Mylar. Photoresist composition and processing were as in Example 1. Immersion in a 10% potassium hydroxide-water solution for 2 minutes affected neither the exposed nor unexposed areas.

EXAMPLE 5

A solution comprising 300 ml methanol, 100 ml water and 10 grams potassium hydroxide dissolved the aluminum in the unexposed areas of Example 13 within 2 minutes without affecting the light exposed areas.

EXAMPLE 6

Sealed, colored, anodized aluminum was coated and processed as in Example 13. Immersion in a solution of 400 ml water, 100 ml n-propanol, 50 ml methanol and 80 grams potassium hydroxide for 60 seconds produced selective dissolution of the anodized aluminum in the unexposed areas baring the aluminum while the exposed areas were completely unaffected.

It will be seen that any solvent for unreacted polymeric binder may be added to a normally employed etching solution in order to accomplish simultaneous development and etching and eliminate the need for the post development baking step normally employed in photofabrication processes. Of course the added solvent must be one which is compatible with the etchant and which does not chemically react therewith in a manner which destroys its effectiveness. Examples of solvents for polymeric binder which have been employed are methanol, ethanol, propanol, butanol, hydrochloric acid, sulfuric acid, acetic acid, citric acid, oxalic acid and hydrofluoric acid. The proportion of solvent to etchant will depend on the nature of the etchant and the material to be etched, as well as the desired etching time. Such proportions must be empirically determined in every case.

Two other additional advantages of simultaneous development and etching have been observed. First, the degree of undercutting is less than experienced in sequential developing and etching. Second, apparent photographic sensitivity is higher by a factor of two to four, i.e., the criterion is photoresist film integrity through the etching step i.e. no pinholing or other evidence of degradation. Minimum exposure energy for sequential processing (development, baking and etching) is two or four times greater than for simultaneous processing.

What is claimed is:

1. In a process for processing a photoresist which consists in:

preparing a resist by applying a non-silver photosensitive layer to a suitable substrate, said layer having a composition which consists essentially of (1) an N-vinyl amine, (2) an organic halogen compound in which at least three atoms of a halogen selected from the group consisting of Cl, Br and I are attached to a single carbon atom, and (3) a binder; said photosensitive layer having a thickness between about 0.5 and 5 microns thick;

imagewise exposing said layer to a pattern of actinic radiation in an amount sufficient to produce a change in said layer; and then fixing said layer by heating to between about 80° and 160°C for up to about 1 minute to fix the image formed in said layer by said preceding exposure; the improvement which comprises:

thereafter contacting said layer with a liquid which comprises (1) a developer for the resist layer which includes a solvent selected from the from the group consisting of lower aliphatic alcohols and (2) an etchant for said substrate, selected from the group consisting of alkalies.

2. The process of claim 1 in which the N-vinyl amine is N-vinylcarbazole.

3. The process of claim 1 wherein the imagewise exposure is about 10 millijuoles/sq. cm.

4. The process of claim 1 wherein the substrates consists of anodized aluminum.

* * * * *